(12) United States Patent
Arai

(10) Patent No.: US 8,044,731 B2
(45) Date of Patent: Oct. 25, 2011

(54) OSCILLATOR CIRCUIT

(75) Inventor: Kenji Arai, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 37 days.

(21) Appl. No.: 12/694,481

(22) Filed: Jan. 27, 2010

(65) Prior Publication Data

US 2010/0188156 A1    Jul. 29, 2010

(30) Foreign Application Priority Data

Jan. 28, 2009    (JP) ................ 2009-016438

(51) Int. Cl.
*H03B 5/36* (2006.01)
*H03L 5/00* (2006.01)

(52) U.S. Cl. ............ 331/116 FE; 331/160; 331/109; 331/183

(58) Field of Classification Search ............ 331/116 R, 331/116 FE, 158, 160, 109, 182, 183, 15
See application file for complete search history.

(56) References Cited

U.S. PATENT DOCUMENTS 7,471,163 B2 * 12/2008 Chuah et al. ............ 331/116 FE
7,683,730 B2 *  3/2010 Cetin et al. ................ 331/186

FOREIGN PATENT DOCUMENTS

JP    6120732 A    4/1994

* cited by examiner

*Primary Examiner* — Ryan Johnson
(74) *Attorney, Agent, or Firm* — Volentine & Whitt, PLLC

(57) ABSTRACT

There is provided an oscillator circuit including: a current source; a resonant unit; an oscillation amplification unit connected to the current source and connected in parallel to the resonant unit; a feedback resistor connected in parallel to the oscillation amplification unit; a switch unit having a first end connected to the current source side of the oscillation amplification unit; a replica circuit connected between a second end of the switch unit and a ground side of the oscillation amplification unit and having a configuration identical to a configuration of the oscillation amplification unit; and a level detecting unit that detects an input voltage of the oscillation amplification unit, and, when the detected input voltage is higher than a bias voltage level at a time of oscillation, cause the switch unit to allow a current from the current sources to bypass through the replica circuit.

18 Claims, 16 Drawing Sheets

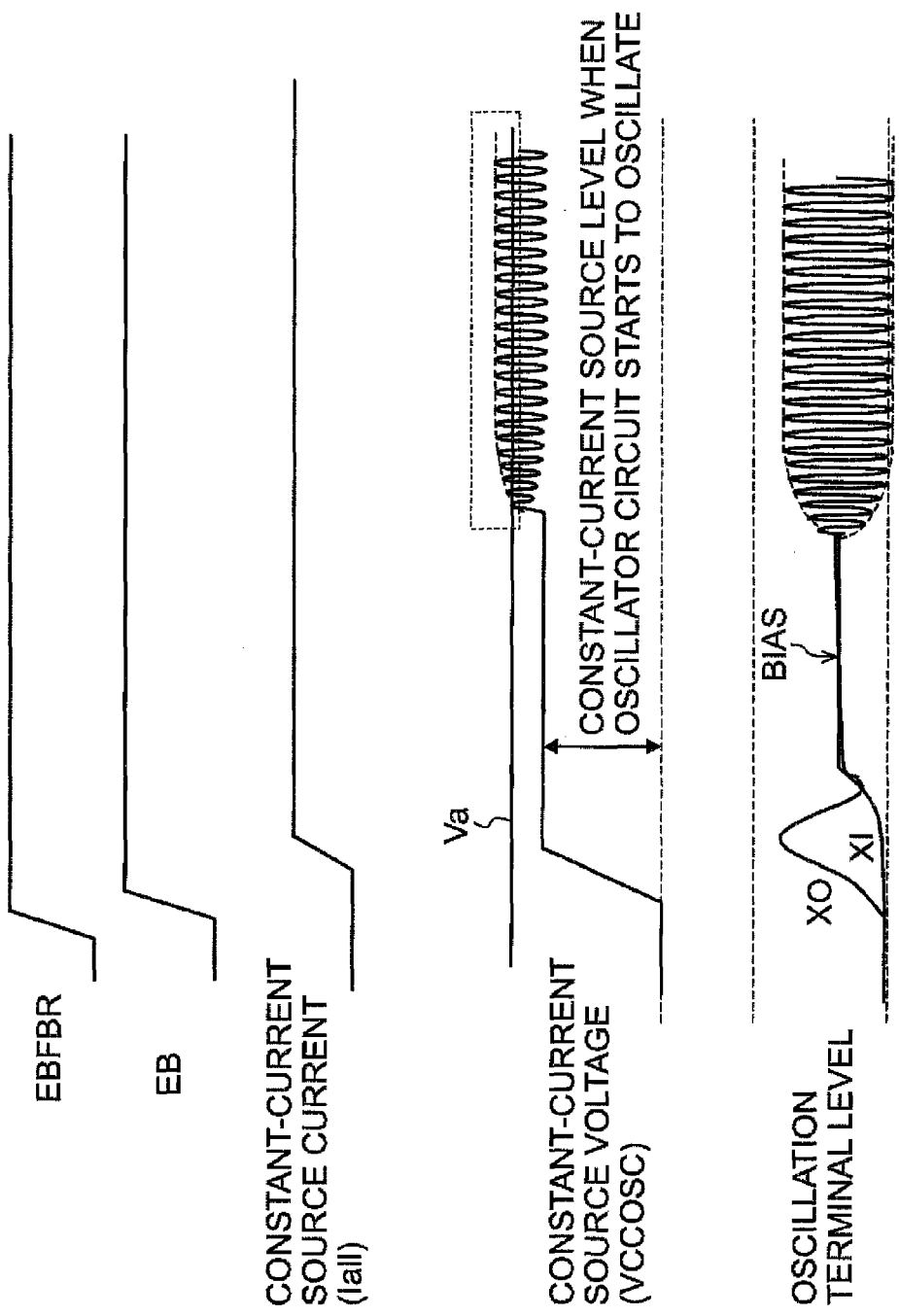

OSCILLATOR CIRCUIT

CROSS-REFERENCE TO RELATED APPLICATION

This application is based on and claims priority under 35 USC 119 from Japanese Patent Application No. 2009-016438 filed on Jan. 28, 2009, the disclosure of which is incorporated by reference herein.

BACKGROUND

1. Technical Field

The present invention relates to an oscillator circuit, and, particularly, to an oscillator circuit formed on a semiconductor integrated circuit and connected to a resonant circuit including a crystal unit, a ceramic resonator, an LC circuit and the like.

2. Related Art

According to the related art, an oscillator circuit formed on a semiconductor integrated circuit while being connected to a crystal unit so as to exhibit an oscillation has been used (see, for example, Japanese Patent Application Laid-Open (JP-A) NO. H06-120732). In such an oscillator circuit, in order to lower a supply voltage and obtain a wide range and low current consumption when a battery is used, there has been proposed an oscillator circuit using a PTAT (Proportional Absolute Temperature) current source, which uses a reference current such as a bandgap current, and an inverter type oscillating buffer.

As the oscillator circuit according to the related art, in order to obtain an oscillation gain with a desired magnitude under the low supply voltage, an oscillating inverting amplifier has been designed with a core transistor.

In a core transistor (for example, with a supply voltage of 1.8 V), as compared with an I/O (Input/Output) transistor (for example, with a supply voltage of 3.3 V) constituting an I/O circuit, it is typical for the thickness of a gate oxide layer to be thin and the breakdown voltage to be low. As compared with the I/O transistor, the core transistor can allow a desired current to flow at a lower voltage by the magnitude relation of the gate oxide layer. Thus, an oscillation gain with a desired magnitude can be ensured at a low supply voltage. That is, the core transistor is more adapted to low power consumption as compared with the I/O transistor.

FIG. 15 shows one example of such an oscillator circuit. As shown in FIG. 15, the oscillator circuit 100 includes a PTAT current source 12, an oscillating buffer 14, an NMOS transistor 16, a feedback resistor Rf, switch devices 20A and 20B and an output buffer 22.

The PTAT current source 12 includes a bias current generating circuit 28, a current mirror circuit 38 and a PMOS transistor 40. The bias current generating circuit 28 includes a PMOS transistor 24, and a bandgap current source 26 provided with a diode and a bipolar device. The current mirror circuit 38 includes PMOS transistors 30 and 32 and NMOS transistors 34 and 36.

The oscillating buffer 14 includes a CMOS inverter formed by a PMOS transistor 42 and an NMOS transistor 44. A source of the PMOS transistor 42 is connected to a drain of the PMOS transistor 40. A source of the NMOS transistor 44 is connected to a drain of the NMOS transistor 16. A source of the NMOS transistor 16 is grounded. A gate of the NMOS transistor 16 is connected to an enable terminal EB.

The feedback resistor Rf is connected in parallel to the oscillating buffer 14. The switch device 20A is connected between one end of the feedback resistor Rf and an input side of the oscillating buffer 14. The switch device 20B is connected between the other end of the feedback resistor Rf and an output side of the oscillating buffer 14.

The switch devices 20A and 20B, for example, each include an NMOS transistor, and have gates connected to a feedback resistor enable terminal EBFBR. Further, the switch devices 20A and 20B may use a transfer gate including a PMOS transistor and an NMOS transistor.

The input side of the oscillating buffer 14, that is, the gates of the PMOS transistor 42 and the NMOS transistor 44 are connected to an input terminal XI. The output side of the oscillating buffer 14, that is, the drains of the PMOS transistor 42 and the NMOS transistor 44 are connected to an output terminal XO and an input terminal of the output buffer 22.

A resonant circuit 46 is connected to the input terminal XI and the output terminal XO. The resonant circuit 46 includes a crystal unit Xtal, external capacitors Cg and Cd, and a dumping resistor Rd. The dumping resistor Rd is provided to adjust a resistance value, thereby reducing the probability that the crystal unit Xtal will break when an excitation level (power from a current Id flowing when the external capacitor Cd is charged) of the oscillator circuit is higher than the power designated by the crystal unit Xtal.

Hereinafter, a typical oscillating behavior of the oscillator circuit 100 will be described.

When the oscillator circuit starts to oscillate, as shown in FIG. 16, a control signal input to the feedback resistor enable terminal EBFBR is changed from a low level (hereinafter, referred to an L level) to a high level (hereinafter, referred to an H level) and a control signal input to the enable terminal EB is changed from an L level to an H level, so that the PTAT current source 12 starts to operate.

Thus, the NMOS transistor 16 is turned on and the switch devices 20A and 20B are turned on. The PTAT current source 12 allows a bias current Ibg generated by the bias current generating circuit 28 and a current Iall set by the current mirror circuit 38 to flow.

Thereafter, voltage levels of each node (terminal) are changed as follows. First, when the voltage level of the output terminal XO in its initial state is 0 [V] level, the current Iall flows toward the external capacitor Cd from the PTAT current source 12 and is stored in the external capacitor Cd, so that the voltage level of the output terminal XO is increased as indicated in FIG. 16.

If the voltage level of the output terminal XO is increased, the current from the PTAT current source 12 flows toward the input terminal XI through the feedback resistor Rf (for example, a resistance value thereof is about 1M). As a result, the external capacitor Cd is charged, so that the voltage level of the input terminal XI is increased as shown in FIG. 16.

If the voltage level of the input terminal XI is increased from an initial state (about 0[V]) and then reaches the vicinity of a threshold voltage Vth of the NMOS transistor 44 included in the oscillating buffer 14, the oscillating buffer 14 is turned on, so that the voltage levels of the input terminal XI and the output terminal XO reach a bias level BIAS as shown in FIG. 16. From such a state, a signal of an oscillation frequency based on the crystal unit Xtal is amplified, so that the oscillator circuit starts to oscillate as shown in FIG. 16.

In the oscillator circuit 100 according to the related art, when starting an oscillation operation from an oscillation stop state, in order to ensure a gain necessary for starting the oscillation operation, the PTAT current source 12 is designed such that the maximum current flows when output and input of the oscillating buffer 14 is at the level of an operation bias point (≈a voltage level corresponding to ½ of a supply voltage VDD or a voltage level corresponding to ½ of a voltage of an output node VCCOSC of the PTAT current source 12) of the oscillating buffer 14 through the feedback resistor Rf.

In order to amplify a minute signal, increasing the current is necessary to increase a gain during that time. However, if the oscillator circuit starts to oscillate once, the crystal unit Xtal operates as a resonant circuit (tank circuit). Thus, a current as much as when the oscillator circuit starts to oscillate is not necessary.

Further, in a case in which the supply voltage VDD is higher than the breakdown voltage of the core transistor and the oscillating buffer 14 is employed as the core transistor in order to obtain a high gain when the oscillator circuit starts to oscillate, when an input amplitude is increased when the oscillation is stabilized, the PMOS transistor 42 is turned off. However, since the PTAT current source 12 allows a constant current to flow toward the PMOS transistor 42, the voltage of the node VCCOSC between the PMOS transistor 42 and the PMOS transistor 40 of the PTAT current source 12 is increased. As shown in FIG. 17A, when an input waveform of the input terminal XI is at a high level, since the PMOS transistor 42 is turned off, the voltage level of the node VCCOSC is increased. Further, as shown in FIG. 17B, when the input waveform of the input terminal XI is at a low level, although the PMOS transistor 42 is turned on, after the voltage level of the output terminal XO is increased, a supply current from the PTAT current source 12 becomes large, so that the voltage level of the node VCCOSC is increased.

Therefore, as indicated by the voltage of the node VCCOSC of FIG. 16, the voltage of the node VCCOSC when the oscillator circuit starts to oscillate may exceed a breakdown voltage level Va of the PMOS transistor 42 serving as the core transistor.

SUMMARY

The advantage of some aspects of the invention is to provide an oscillator circuit capable of preventing an overvoltage from being applied to an oscillating buffer.

According to one aspect of the invention, there is provided an oscillator circuit including: a current source; a resonant unit; an oscillation amplification unit connected to the current source and connected in parallel to the resonant unit; a feedback resistor connected in parallel to the oscillation amplification unit; a switch unit having a first end connected to the current source side of the oscillation amplification unit; a replica circuit connected between a second end of the switch unit and a ground side of the oscillation amplification unit and having a configuration identical to a configuration of the oscillation amplification unit; and a level detecting unit that detects an input voltage of the oscillation amplification unit, and, when the detected input voltage is higher than a bias voltage level at a time of oscillation by an amount equal to or greater than a predetermined amount, or when the detected input voltage is lower than a bias voltage level at the time of the oscillation by an amount equal to or greater than a predetermined amount, outputs to the switch unit a control signal used to allow a current from the current sources to bypass through the replica circuit, to prevent a voltage level of a connection point of the current source and the oscillation amplification unit from exceeding a breakdown voltage of the oscillation amplification unit.

According to another aspect of the invention, there is provided An oscillator circuit including: a current source including plural MOS transistors; a resonant unit; an oscillation amplification unit connected to at least one first MOS transistor of the plural MOS transistors and connected in parallel to the resonant unit; a feedback resistor connected in parallel to the oscillation amplification unit; a switch unit having a first end connected to at least one second MOS transistor different from the first MOS transistor among the plural MOS transistors, and a second end connected to a connection point of the first MOS transistor and the oscillation amplification unit; and a level detecting unit detecting an input voltage of the oscillation amplification unit, and, when the detected input voltage is higher than a bias voltage level at a time of oscillation by an amount equal to or greater than a predetermined amount, or when the detected input voltage is lower than a bias voltage level at the time of the oscillation by an amount equal to or greater than a predetermined amount, outputs to the switch unit a control signal used to prevent a current from the second MOS transistor from flowing through the oscillation amplification unit, thereby preventing a voltage level of a connection point of the current source and the oscillation amplification unit from exceeding a breakdown voltage of the oscillation amplification unit.

BRIEF DESCRIPTION OF THE DRAWINGS

Exemplary embodiments of the present invention will be described in detail based on the following figures, wherein:

FIG. 16 illustrates voltage levels of each element of an oscillator circuit according to the related art.

DETAILED DESCRIPTION

First Embodiment

Figure 1:
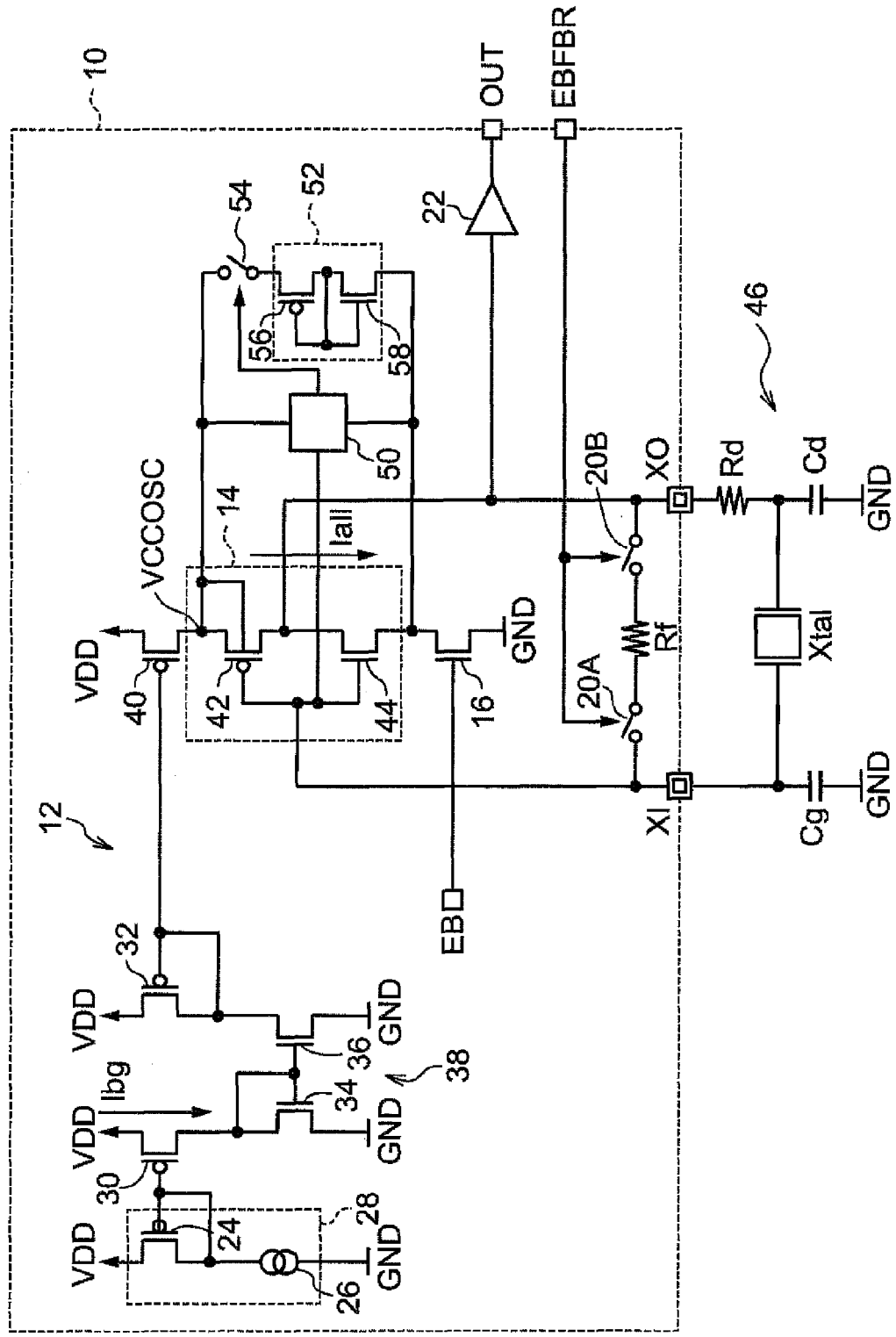
FIG. 1 is a circuit diagram illustrating an oscillator circuit according to a first embodiment.

FIG. 1 is a circuit diagram illustrating the configuration of an oscillator circuit 10 according to the first embodiment of the invention. The same reference numerals are used to designate the same elements as those of an oscillator circuit 100 shown in FIG. 15, and detailed description thereof will be omitted. The following description will be given while focusing on the difference relative to the oscillator circuit 100 shown in FIG. 15.

Figure 15:
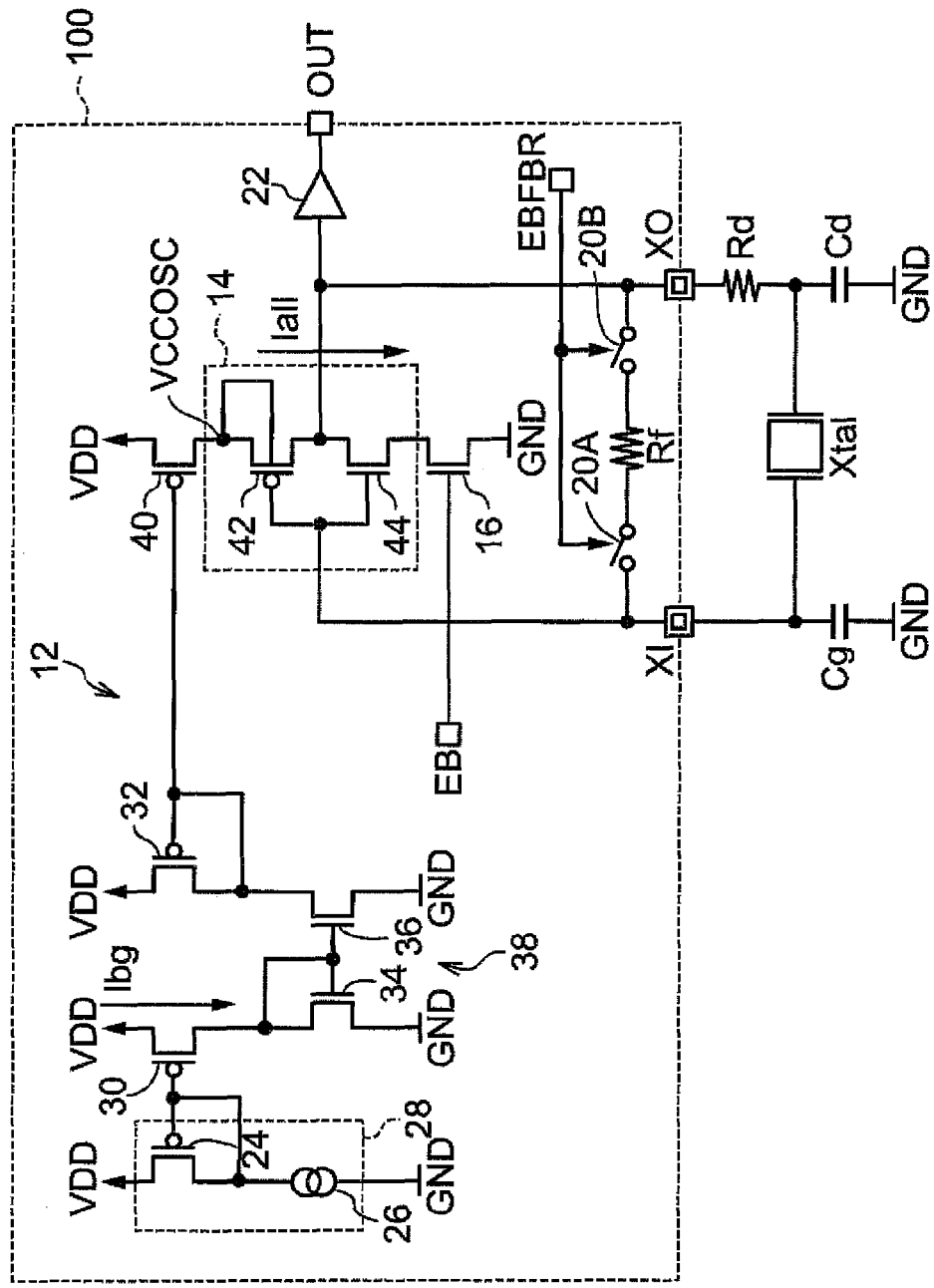
FIG. 15 is a circuit diagram illustrating an oscillator circuit according to the related art.
Figure 17A:
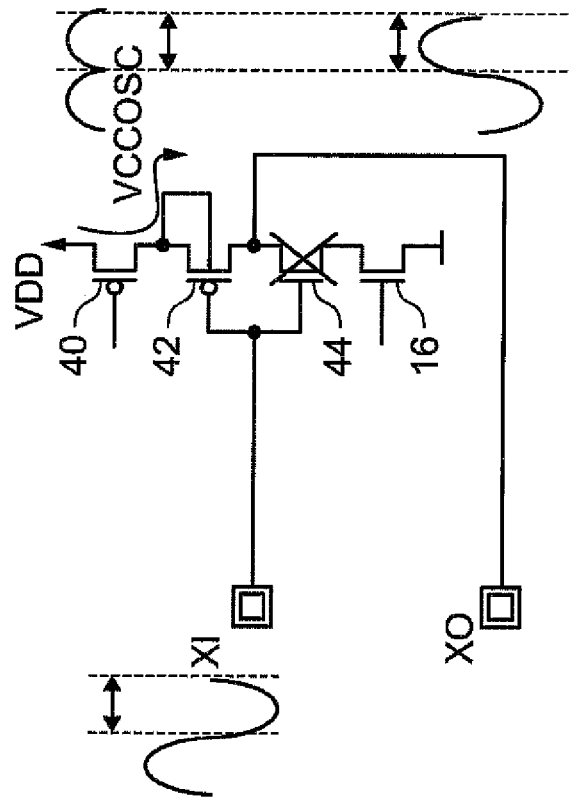
FIG. 17A is a circuit diagram illustrating the flowing of a current in an oscillator circuit according to the related art.
Figure 17B:
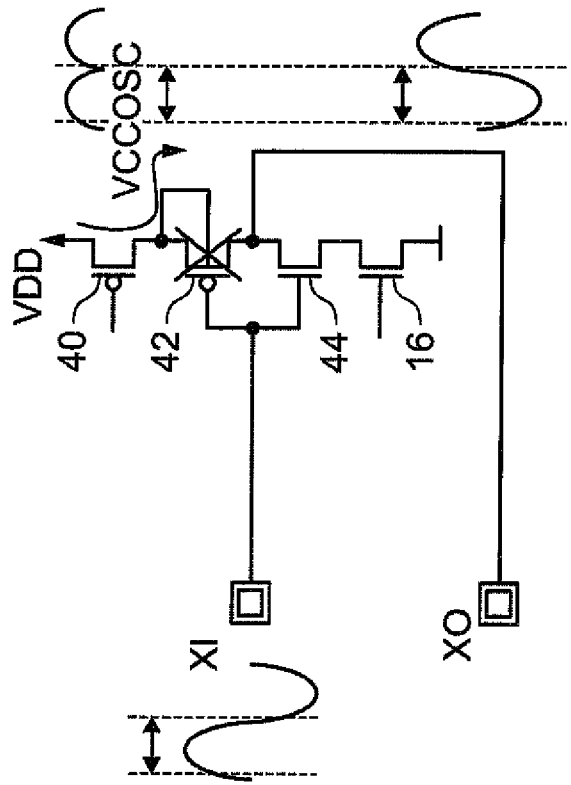
FIG. 17B is a circuit diagram illustrating the flowing of a current in an oscillator circuit according to the related art.

The oscillator circuit 10 shown in FIG. 1 is substantially identical to the oscillator circuit 100 shown in FIG. 15, except for a level detecting circuit 50, a replica buffer 52 and a switch device 54.

The level detecting circuit 50 has an input terminal connected to an input side of the oscillating buffer 14, that is, the input terminal XI, and an output terminal connected to the switch device 54. Further, the level detecting circuit 50 has one power supply terminal connected to the node VCCOSC, and the other power supply terminal connected to a connection point of the NMOS transistor 44 and the NMOS transistor 16.

The replica buffer 52 has the same circuit configuration as that of the oscillating buffer 14. That is, the replica buffer 52 is a CMOS inverter including a PMOS transistor 56, which is identical to the PMOS transistor 42 of the oscillating buffer 14 in terms of the length and width of a gate, and an NMOS transistor 58 which is identical to the NMOS transistor 44 of the oscillating buffer 14 in terms of the length and width of a gate. A source of the PMOS transistor 56 is connected to the switch device 54, and a source of the NMOS transistor 58 is connected to the connection point of the NMOS transistor 44 and the NMOS transistor 16.

When an amplitude level of a voltage input to the gates of the PMOS transistor 42 and the NMOS transistor 44 of the oscillating buffer 14 connected to the crystal unit Xtal through the input terminal XI is higher than an oscillation bias level Vb by $\Delta V$ (=2~30 mV) or more, the level detecting circuit 50 turns on the switch device 54, so that a current from the PTAT current source 12 bypasses through the replica buffer 52. Further, when the amplitude level is lower than the oscillation bias level Vb by $\Delta V$ (=several 10 mV) or less, the level detecting circuit 50 turns on the switch device 54, so that the current from the PTAT current source 12 bypasses through the replica buffer 52.

Figure 2:
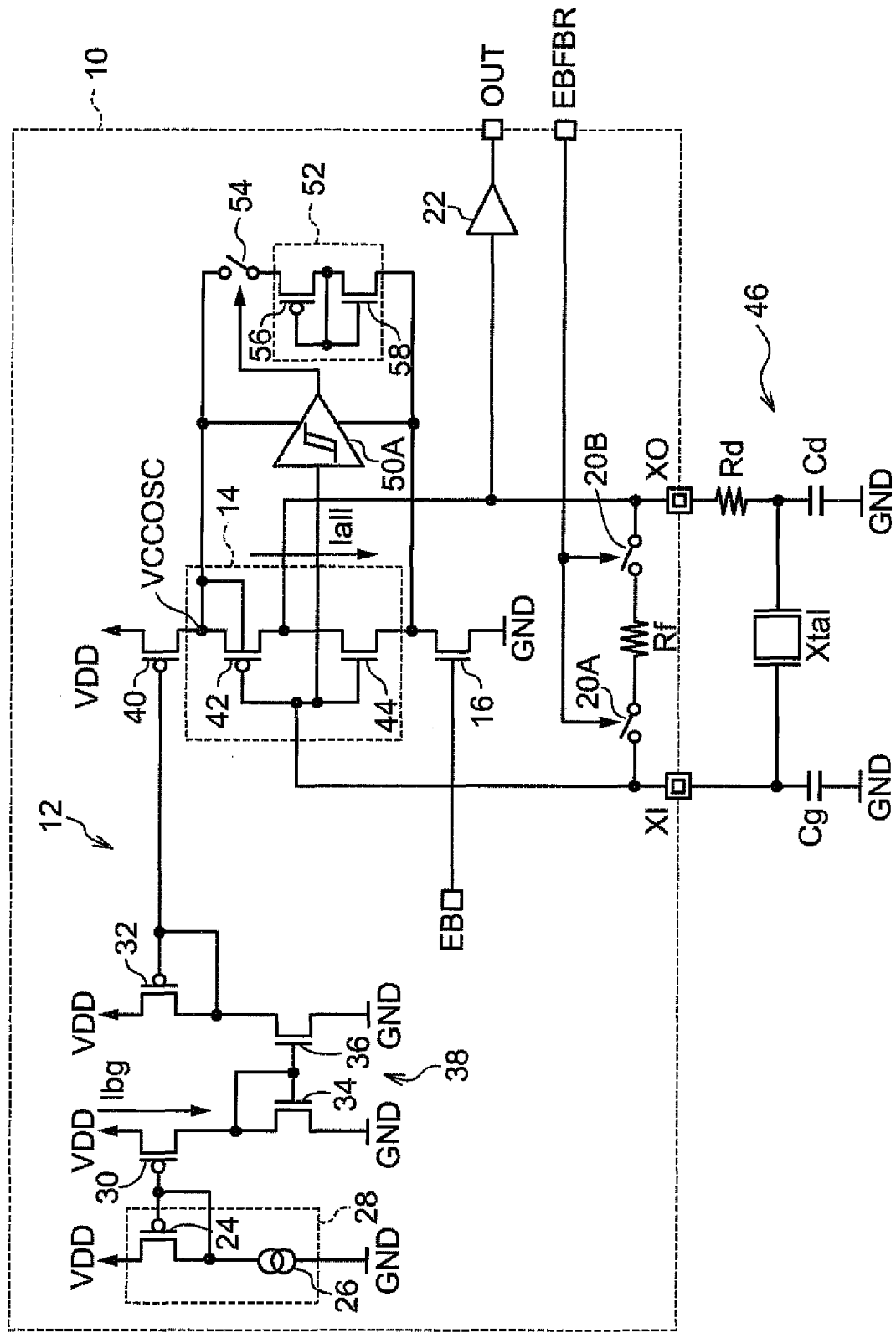
FIG. 2 is a circuit diagram illustrating a detailed example of an oscillator circuit according to a first embodiment.

The level detecting circuit 50, for example, may be formed by a Schmitt circuit (Schmitt inverter) 50A as shown in FIG. 2.

When the switch device 54 is provided between the node VCCOSC and the PMOS transistor 56 of the replica buffer 52 as shown in FIG. 1, it is considered that the same PMOS transistor is formed on the same well. In this regard, the PMOS transistor may be used as the switch device 54. In such a case, the level detecting circuit 50 outputs an L level signal as a signal for turning on the switch device 54.

Further, when the switch device 54 is provided between the NMOS transistor 58 of the replica buffer 52 and the connection point of the NMOS transistor 44 and the NMOS transistor 42, it is considered that the same NMOS transistor is formed on the same well. In this regard, the NMOS transistor may be used as the switch device 54. In such a case, the level detecting circuit 50 outputs an H level signal as a signal for turning on the switch device 54.

Hereinafter, an oscillation operation of the oscillator circuit 10 will be described.

When the oscillator circuit 10 starts to oscillate, a control signal input to the feedback resistor enable terminal EBFBR is changed from the L level to the H level. In addition, a control signal input to the enable terminal EB is changed from the L level to the H level, so that the PTAT current source 12 starts to operate.

Thus, the NMOS transistor 16 is turned on. In addition, the switch devices 20A and 20B are turned on. Further, as shown in FIG. 2, the PTAT current source 12 allows the bias current Ibg generated by the bias current generating circuit 28 and the current Iall set by the current mirror circuit 38 to flow.

Thereafter, the voltage levels of each node (terminal) are changed as follows. First, when the voltage level of the output terminal XO is changed from the initial state to 0 [V] level, the current Iall flows toward the external capacitor Cd from the PTAT current source 12 and is stored in the external capacitor Cd, so that the voltage level VO of the output terminal XO is increased.

If the voltage level VO of the output terminal XO is increased, the current from the PTAT current source 12 flows toward the input terminal XI through the feedback resistor Rf. As a result, the external capacitor Cg is charged, so that the voltage level VI of the input terminal XI is increased.

If the voltage level of the input terminal XI is increased from the initial state (about 0[V]) and then reaches up to approximately the threshold voltage Vth of the NMOS transistor 44 included in the oscillating buffer 14, the NMOS transistor 44 of the oscillating buffer 14 is turned on. Thus, a bias current flows into a ground voltage level GND from the output terminal XO through the NMOS transistors 44 and 16. At this time, as shown in FIG. 3, the voltage level in the node VCCOSC, which serves as the source of the PMOS transistor 42 of the oscillating buffer 14 is fixed by the current Iall flowing into the NMOS transistor 44 of the oscillating buffer 14 from the PTAT current source 12, and a bias current flows into the NMOS transistor 44 of the oscillating buffer 14 from the output terminal XO.

Figure 3:
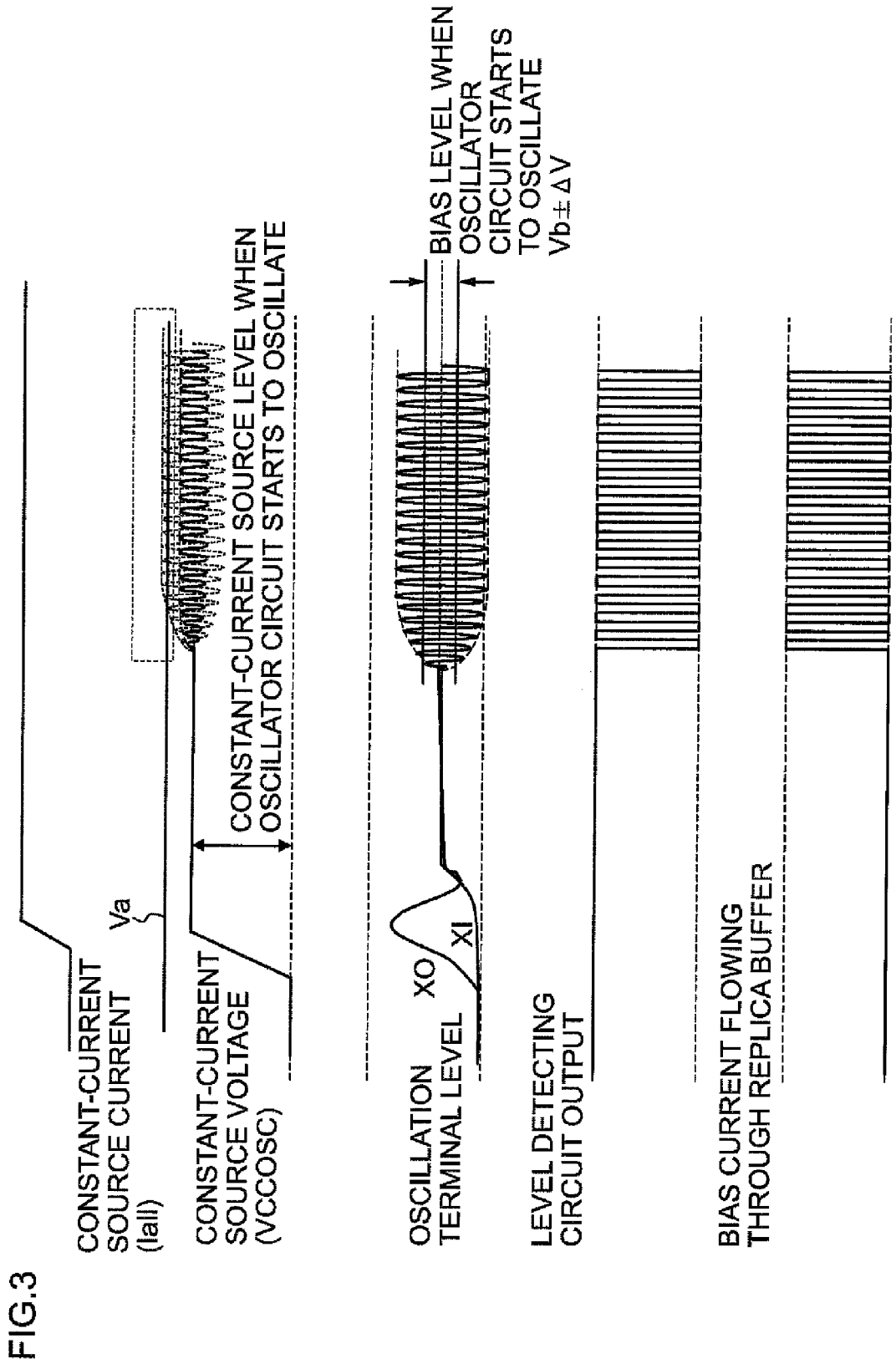
FIG. 3 illustrates voltage levels of each element of an oscillator circuit according to a first embodiment.

Further, as shown in FIG. 3, the input terminal XI and the output terminal XO become the oscillation bias level Vb (same voltage level) of the oscillating buffer 14. Herein, an oscillation starting-standby state by the crystal unit Xtal is reached.

Further, a signal of an oscillation frequency based on the crystal unit Xtal is amplified from the above state, so that the oscillator circuit 10 starts to oscillate as shown in FIG. 3.

Meanwhile, the level detecting circuit 50 detects the amplitude level of the voltage input to the gates of the PMOS transistor 42 and the NMOS transistor 44 of the oscillating buffer 14, and the level detecting circuit 50 outputs an H level signal to the switch device 54 to turn off the switch device 54 when the detected amplitude level of the input side of the oscillating buffer 14 exists in the range of the oscillation bias level Vb±$\Delta V$ (=Vb±several 10 mV).

Thus, in an oscillation starting period from the starting of current supply from the PTAT current source 12 to the starting of oscillation, as shown in the level detection circuit output of FIG. 2, since the level detecting circuit 50 outputs the H level signal to the switch device 54, the switch device 54 is turned off. Consequently, as shown in FIG. 3, the current from the PTAT current source 12 does not flow through the replica buffer 52.

Further, when the detected amplitude level of the input side of the oscillating buffer 14 is beyond the range of the oscillation bias level Vb±ΔV, the level detecting circuit 50 outputs an L level signal to the switch device 54 to turn on the switch device 54.

Thus, after the oscillator circuit 10 starts to oscillate, as shown in the level detection circuit output of FIG. 3, the level detecting circuit 50 alternately outputs the H level signal and the L level signal to the switch device 54 to intermittently turn on and off the switch device 54. Consequently, after the oscillation is started, as shown in the bias current flowing through the replica buffer of FIG. 3, the current from the PTAT current source 12 intermittently bypasses through the replica buffer 52.

Figure 4:
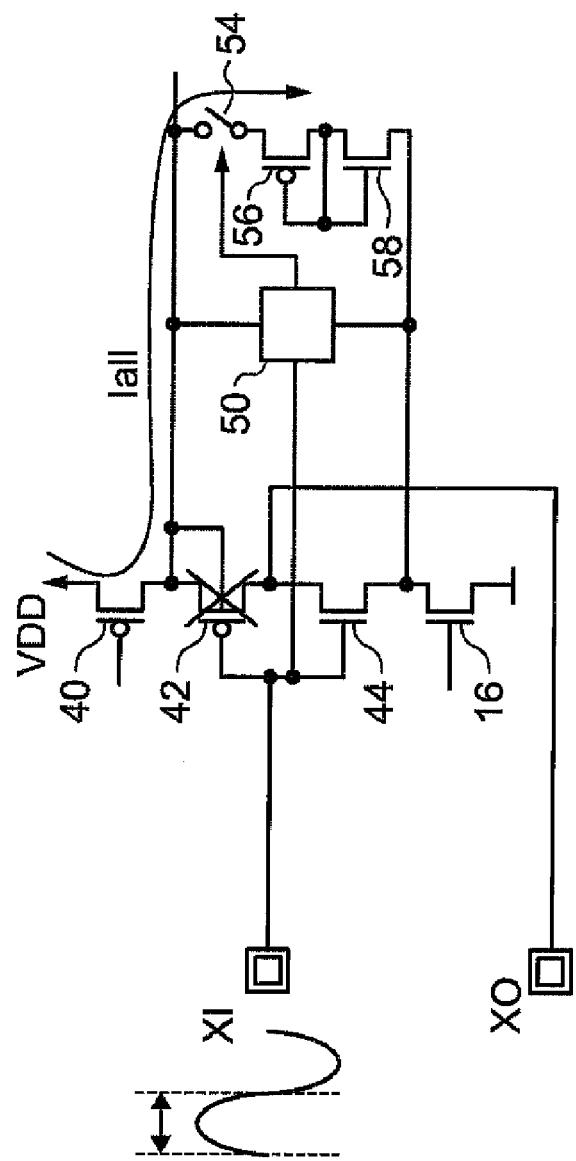
FIG. 4 is a circuit diagram illustrating the flowing of a current in an oscillator circuit according to a first embodiment.

As described above, after the oscillator circuit 10 starts to oscillate, even if the amplitude level of the input side of the oscillating buffer 14 is beyond the range of the oscillation bias level Vb±ΔV, as shown in FIG. 4, the current Iall from the PTAT current source 12 bypasses through the replica buffer 52. Thus, as shown in the constant-current source voltage (VCCOSC) of FIG. 3, the voltage level of the node VCCOSC can be prevented from exceeding the breakdown voltage level Va of the PMOS transistor 42 and the NMOS transistor 44 serving as the core transistor. Consequently, the oscillation can be prevented from stopping by the break down of these MOS transistors.

Figure 5A:
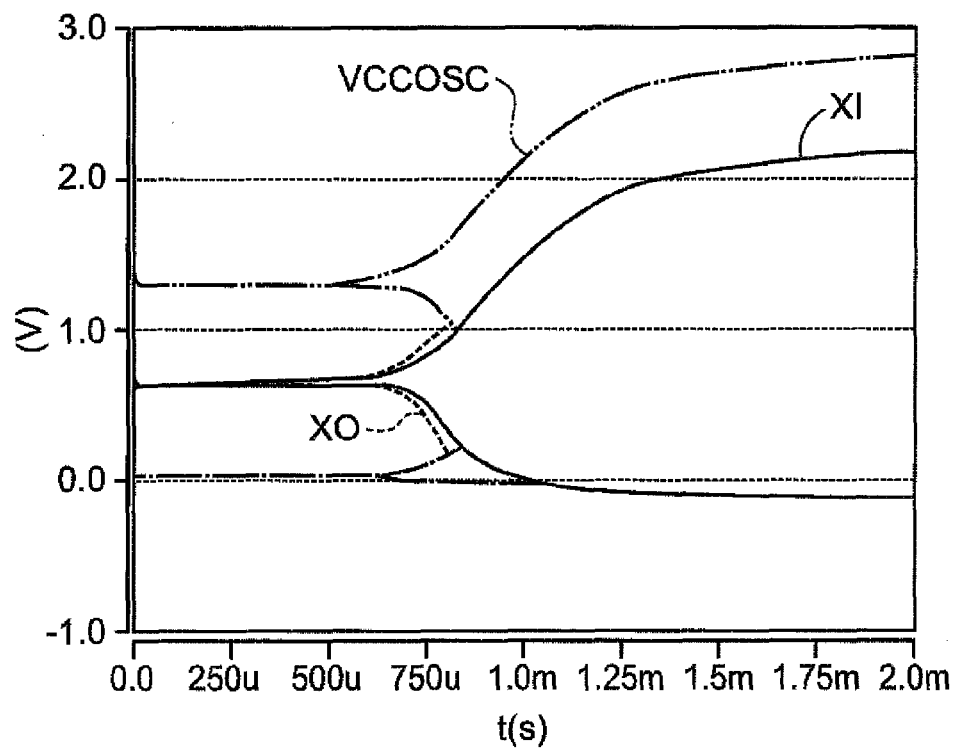
FIG. 5A is a graph illustrating simulation results for an oscillation operation of an oscillation circuit according to the related art.
Figure 5B:
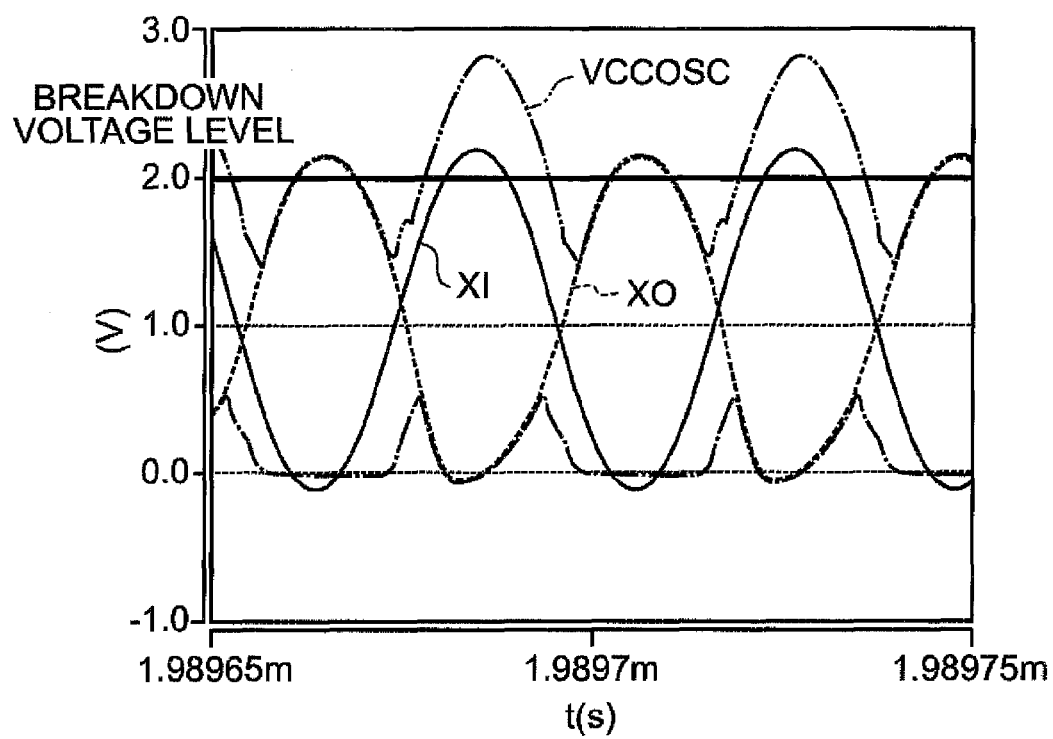
FIG. 5B is a partial enlarged view of FIG. 5A.
Figure 6A:
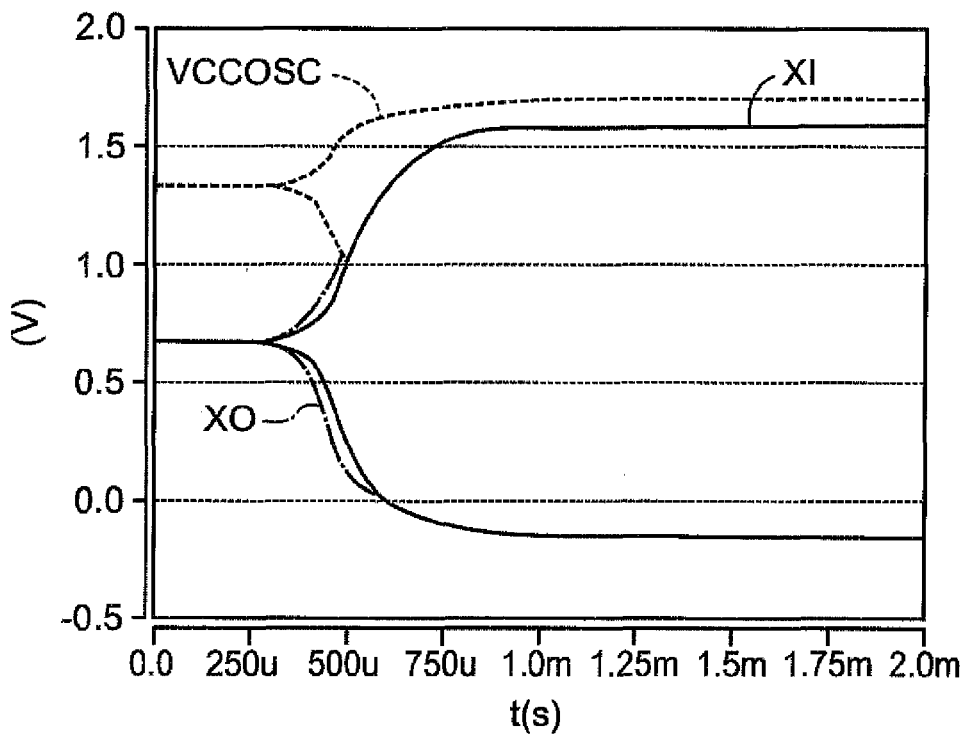
FIG. 6A is a graph illustrating simulation results for an oscillation operation of an oscillation circuit according to a first embodiment.
Figure 6B:
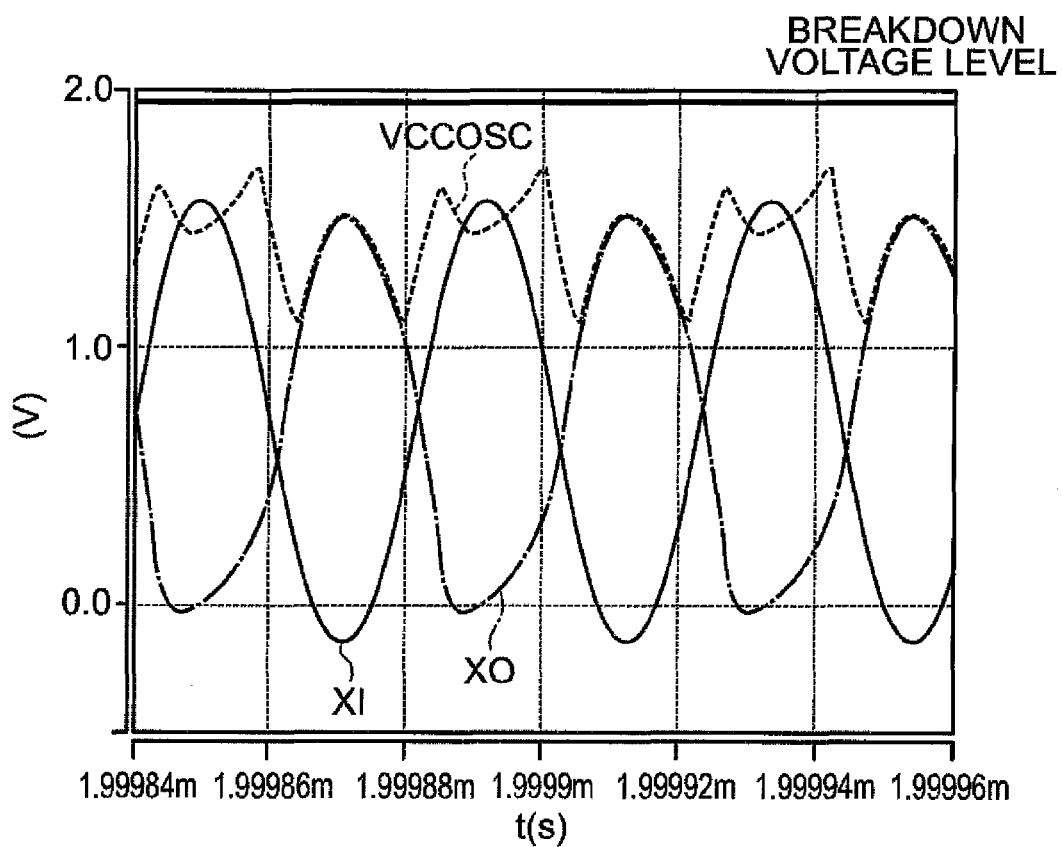
FIG. 6B is a partial enlarged view of FIG. 6A.

FIGS. 5A and 5B illustrate simulation results for the oscillation operation of the oscillation circuit 100 according to the related art. Further, FIGS. 6A and 6B illustrate simulation results for the oscillation operation of the oscillation circuit 10 according to the embodiment. FIG. 5B is a partial enlarged view of FIG. 5A and FIG. 6B is a partial enlarged view of FIG. 6A.

As shown in FIG. 5B, in the oscillation circuit 100 according to the related art, the voltage level of the node VCCOSC exceeds the breakdown voltage level of the core transistor. However, as shown in FIG. 6B, in the oscillation circuit 10 according to the embodiment, the voltage level of the node VCCOSC does not exceed the breakdown voltage level of the core transistor.

Second Embodiment

Next, the second embodiment of the invention will be described. The same reference numerals are used to designate the same elements as those of the first embodiment, and detailed description thereof will be omitted. The following description will be given while focusing on the difference relative to the first embodiment.

Figure 7:
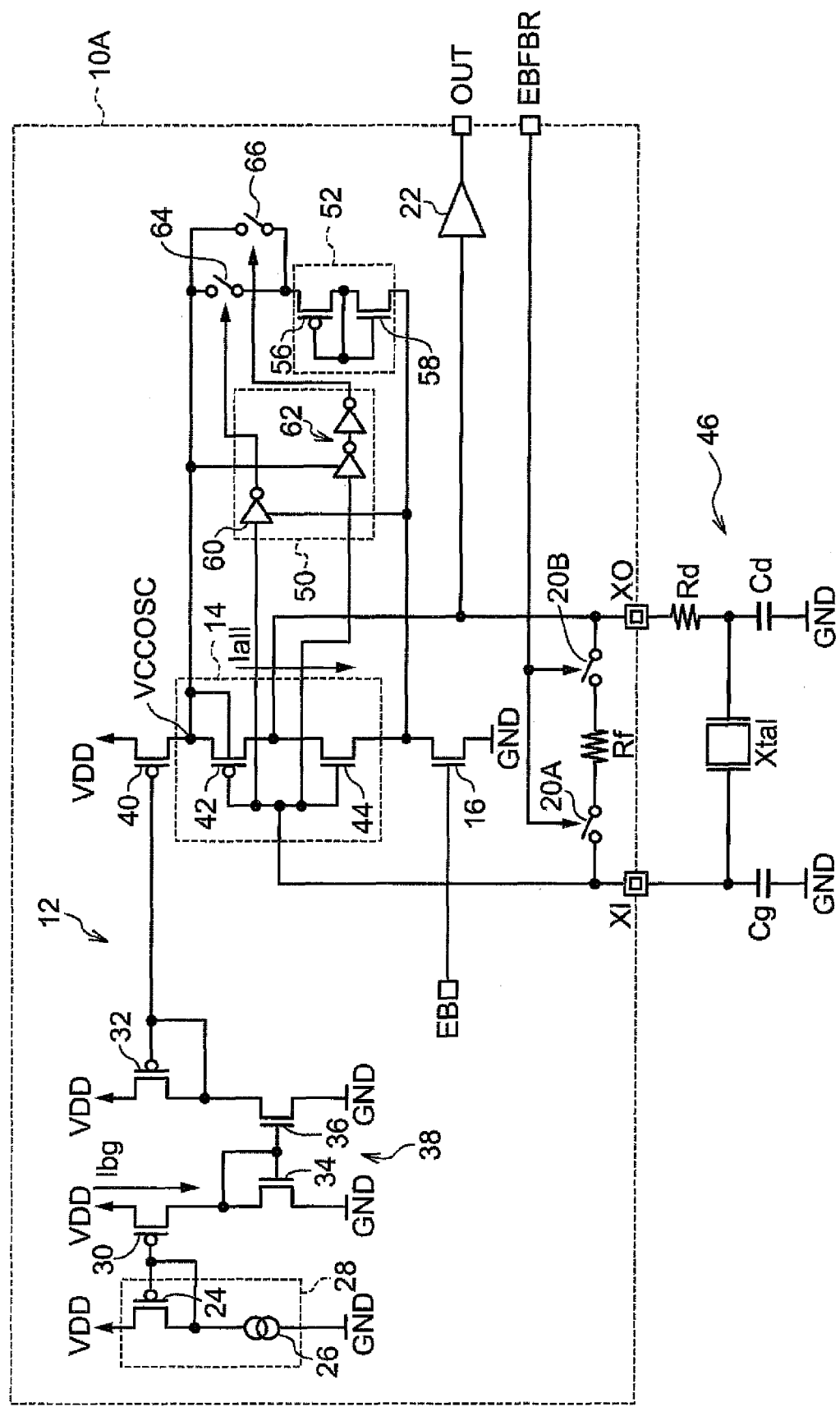
FIG. 7 is a circuit diagram illustrating an oscillator circuit according to a second embodiment.

FIG. 7 illustrates an oscillator circuit 10A according to the embodiment. In the oscillator circuit 10A, the level detecting circuit 50 includes a first inverter circuit 60 and a second inverter circuit 62. Further, the level detecting circuit 50 includes switch devices 64 and 66 with respect to the respective inverter circuits. The switch devices 64 and 66 are connected in parallel to each other between the node VCCOSC and the replica buffer 52. The switch device 64 is turned on and off by the first inverter circuit 60. The switch device 66 is turned on and off by the second inverter circuit 62.

Figure 8:
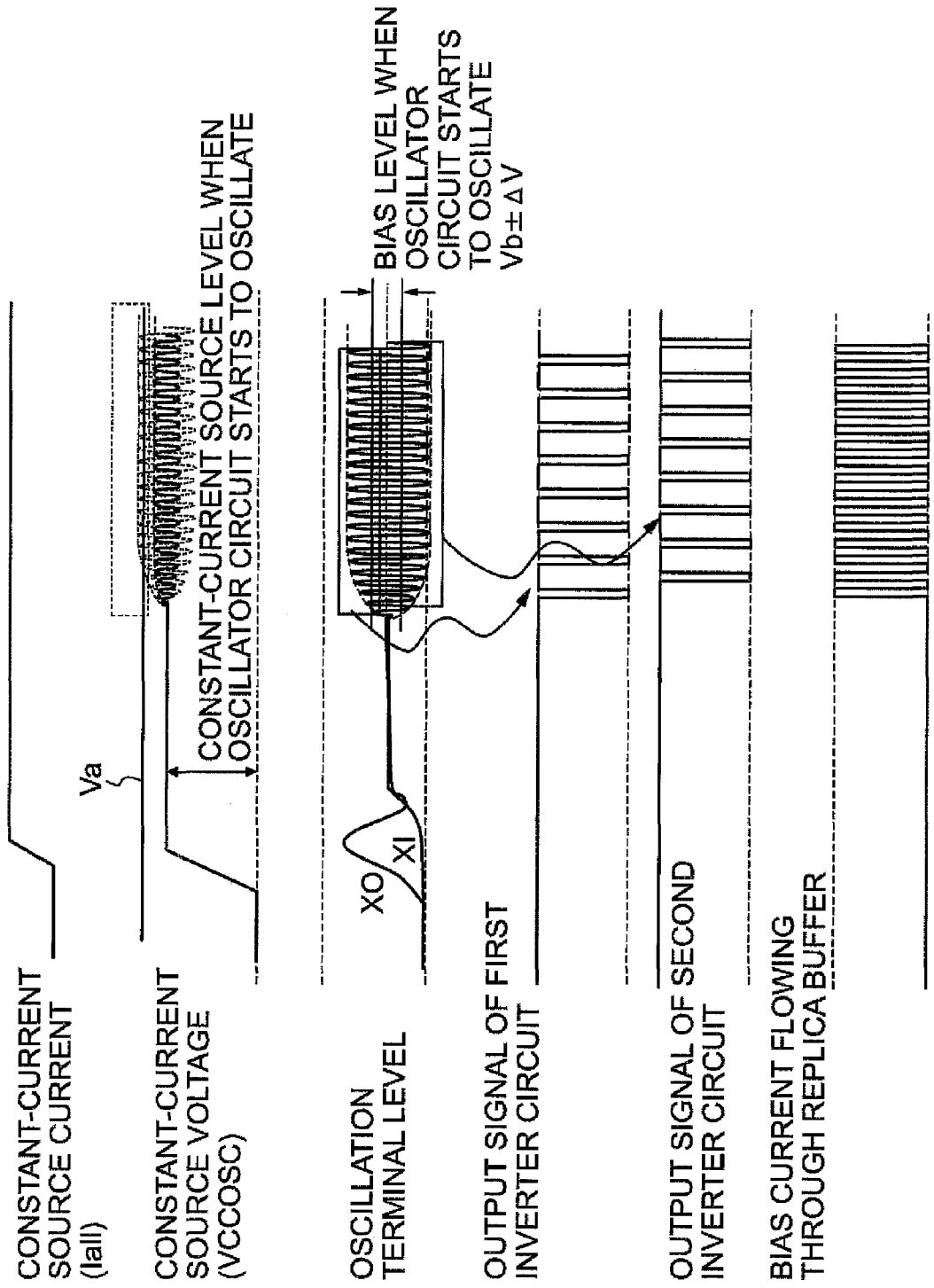
FIG. 8 illustrates voltage levels of each element of an oscillator circuit according to a second embodiment.

The first inverter circuit 60 turns on the switch device 64 when the amplitude level of the input side of the oscillating buffer 14 is higher than the oscillation bias level Vb by ΔV or more. Thus, when the oscillator circuit 10A starts to oscillate, as shown in the output signal of the first inverter circuit of FIG. 8, the first inverter circuit 60 intermittently outputs an L level signal to intermittently turn on the switch device 64. Consequently, the current from the PTAT current source 12 intermittently bypasses through the replica buffer 52 through the switch device 64.

Further, the second inverter circuit 62 turns on the switch device 66 when the amplitude level of the input side of the oscillating buffer 14 is lower than the oscillation bias level Vb by ΔV or less. Thus, when the oscillator circuit 10A starts to oscillate, as shown in the output signal of the second inverter circuit of FIG. 8, the second inverter circuit 62 intermittently outputs an L level signal to intermittently turn on the switch device 66. Consequently, the current from the PTAT current source 12 intermittently bypasses through the replica buffer 52 through the switch device 66.

As described above, after the oscillator circuit 10A starts to oscillate, even if the amplitude level of the input side of the oscillating buffer 14 is beyond the range of the oscillation bias level Vb±ΔV, the current from the PTAT current source 12 bypasses through the replica buffer 52. Thus, as shown in the constant-current source voltage (VCCOSC) of FIG. 8, the voltage level of the node VCCOSC can be prevented from exceeding the breakdown voltage level Va of the PMOS transistor 42 and the NMOS transistor 44 serving as the core transistor. Consequently, the oscillation can be prevented from stopping by the break down of these MOS transistors.

The first inverter circuit 60 and the second inverter circuit 62 may be formed by a PMOS transistor, which is identical to the PMOS transistor 42 of the oscillating buffer 14, or an NMOS transistor, which is identical to the NMOS transistor 44 of the oscillating buffer 14.

Figure 9:
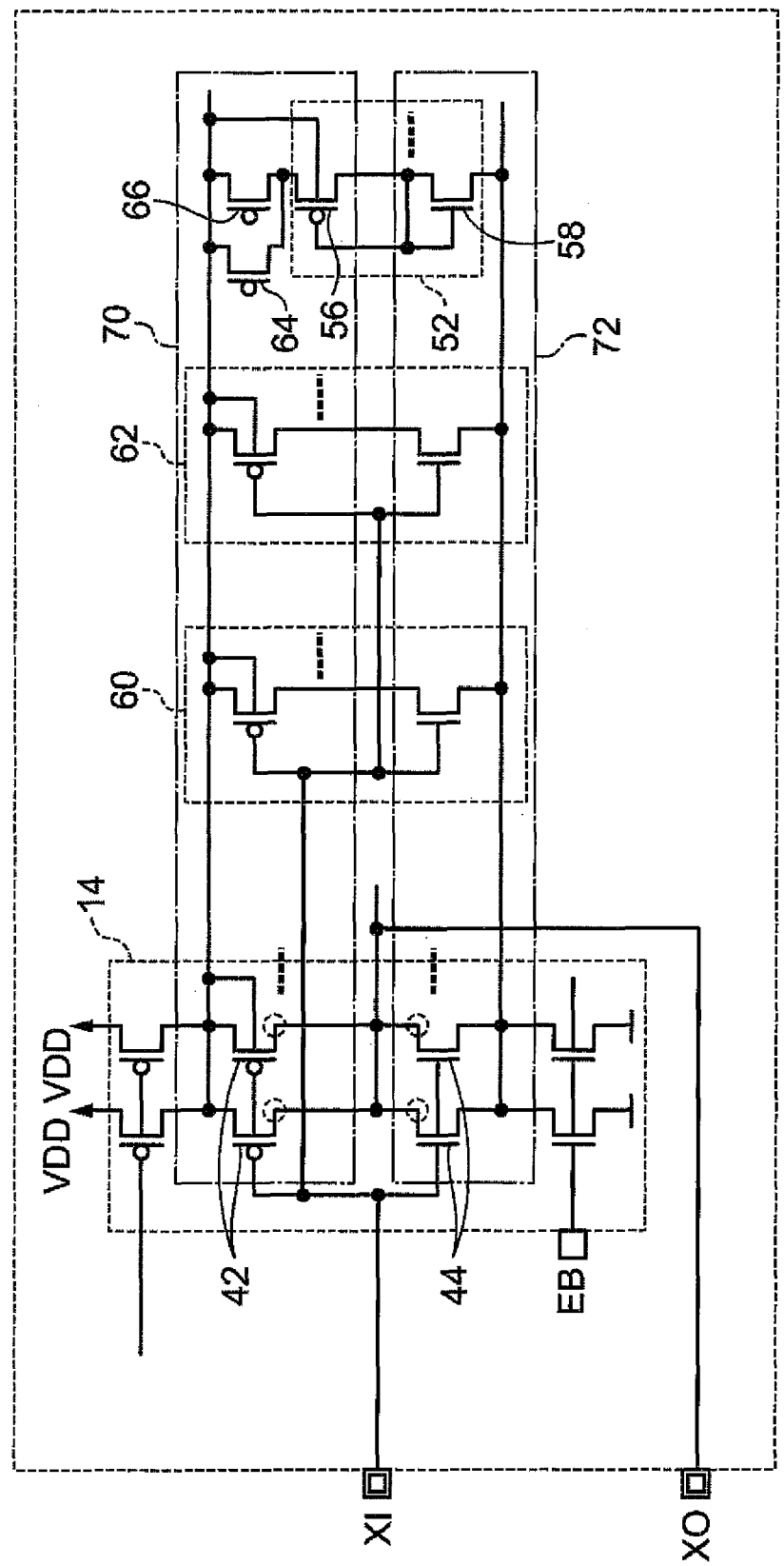
FIG. 9 is a circuit diagram illustrating a layout of an oscillator circuit according to a second embodiment.

As described above, when the oscillating buffer 14, the level detecting circuit 50 and the replica buffer 52 are formed by the same PMOS transistor and NMOS transistor, as shown in FIG. 9, each PMOS transistor may be formed on the same well 70 on a semiconductor substrate and each NMOS transistor may also be formed on the same well 72 on the semiconductor substrate. In FIG. 9, the oscillating buffer 14, the level detecting circuit 50 and the replica buffer 52 each are shown with respect to a case of including plural pairs of the PMOS transistor and the NMOS transistor.

Further, in order to operate at high speeds, each PMOS transistor and each NMOS transistor may have a salicide structure (in which a high speed operation is performed by putting a metal thin film to a gate, a drain, a source and the like) by a salicide process. However, the salicide structure is easily influenced by external noise and the like. In this regard, a salicide block structure, which does not employ the salicide structure, may be applied to the drains (parts indicated by dotted circles in FIG. 9) of the PMOS transistor 42 and the NMOS transistor 44 of the oscillating buffer 14 connected to the output terminal XO. The level detecting circuit 50 or the replica buffer 52 is not connected to an external terminal. In this regard, the salicide structure may be applied to all elements in order to reduce a circuit area.

Further, in order to prevent variation of characteristics due to a semiconductor process, in relation to each PMOS transistor and each NMOS transistor, a current is allowed to flow in a constant direction and each MOS transistor is made into a unit transistor. Allowing the current to flow in the constant direction signifies that the drain, gate and source of each MOS transistor are arranged with the same layout. Further, making each MOS transistor into the unit transistor signifies that all the drain, gate and source of each MOS transistor are not held in common with other MOS transistors, but each MOS transistor is independently formed.

Figure 10:
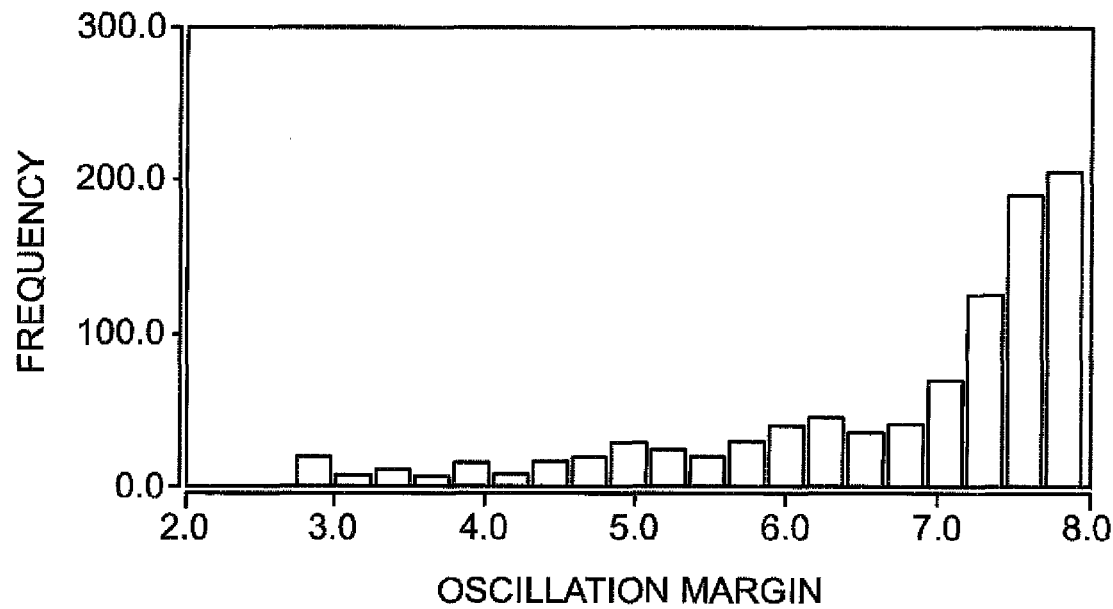
FIG. 10 is a graph illustrating simulation results for an oscillation margin of an oscillation circuit according to the related art.
Figure 11:
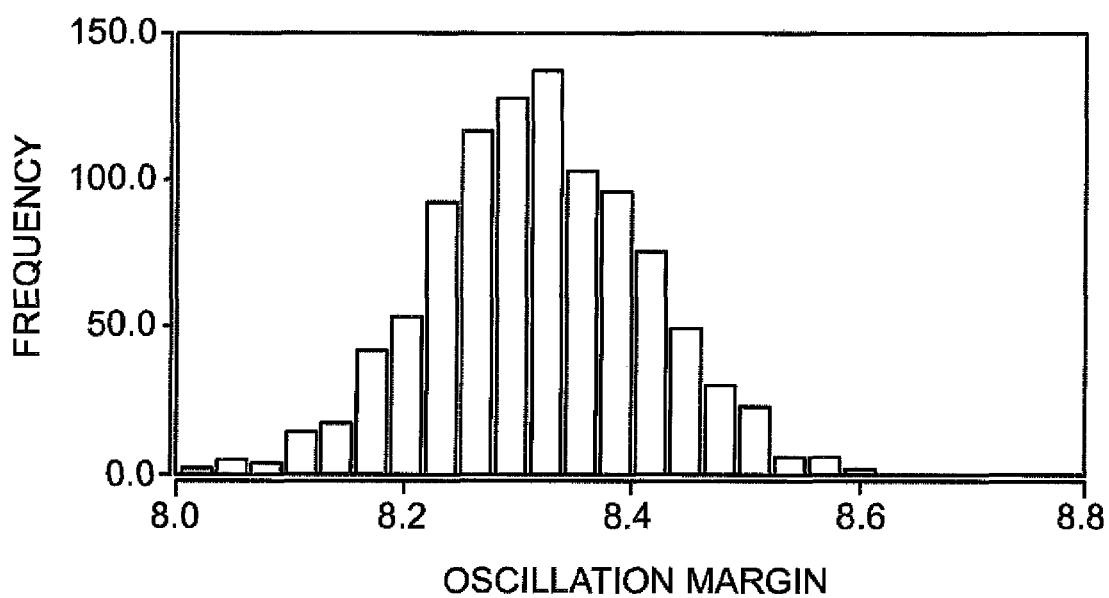
FIG. 11 is a graph illustrating simulation results for an oscillation margin of an oscillation circuit according to the second embodiment.

FIG. 10 illustrates simulation results for an oscillator margin(=Negative Resistance of oscillator circuit/Motional Series Resistance of Crystal unit) of the oscillator circuit when the above countermeasures have not been applied to each MOS transistor, wherein the above countermeasures include forming each MOS transistor on the same well, allowing each MOS transistor to have the salicide structure, allowing a part of the MOS transistors to have the salicide block structure, allowing the current to flow in the constant direction and making each MOS transistor into the unit transistor. FIG. 11 illustrates simulation results for an oscillation margin of the oscillator circuit when the above countermeasures have been applied to each MOS transistor.

As the oscillation margin is high, the oscillation is stabilized, and the oscillation is stopped if the oscillation margin is lower than 1 or less. As shown in FIG. 10, when the countermeasures have not been applied to each MOS transistor, variation occurs in the oscillation margin. However, as shown in FIG. 11, when the countermeasures have been applied to each MOS transistor, it can be understood that variation in the oscillation margin is significantly reduced.

As described above, the countermeasures are applied to the oscillator circuit, so that variation of characteristics due to the semiconductor process can be prevented, and reduction in yield and occurrence of commercial defects can be prevented.

Third Embodiment

Next, the third embodiment of the invention will be described. The same reference numerals are used to designate the same elements as those of the previous embodiments, and detailed description thereof will be omitted. The following description will be given while focusing on the difference relative to the previous embodiments.

In the oscillator circuit 10A described in the second embodiment, PMOS transistors and NMOS transistors, which are identical to those of the oscillating buffer 14, are used for the first inverter circuit 60 and the second inverter circuit 62, which constitute the level detecting circuit. Thus, if the input side of the oscillating buffer 14 is at the oscillation bias level, the first inverter circuit 60 and the second inverter circuit 62 are turned on, so that a current may be shunted. Consequently, a case may occur in which a current necessary for oscillation initiation does not flow through the oscillating buffer 14.

In this regard, if the lengths of the gates of the PMOS transistor and the NMOS transistor, which constitute the first inverter circuit 60 and the second inverter circuit 62, are lengthened to prevent the shunting of the current, a mismatch of the oscillating buffer 14, which is an inverter circuit, may occur.

Figure 12:
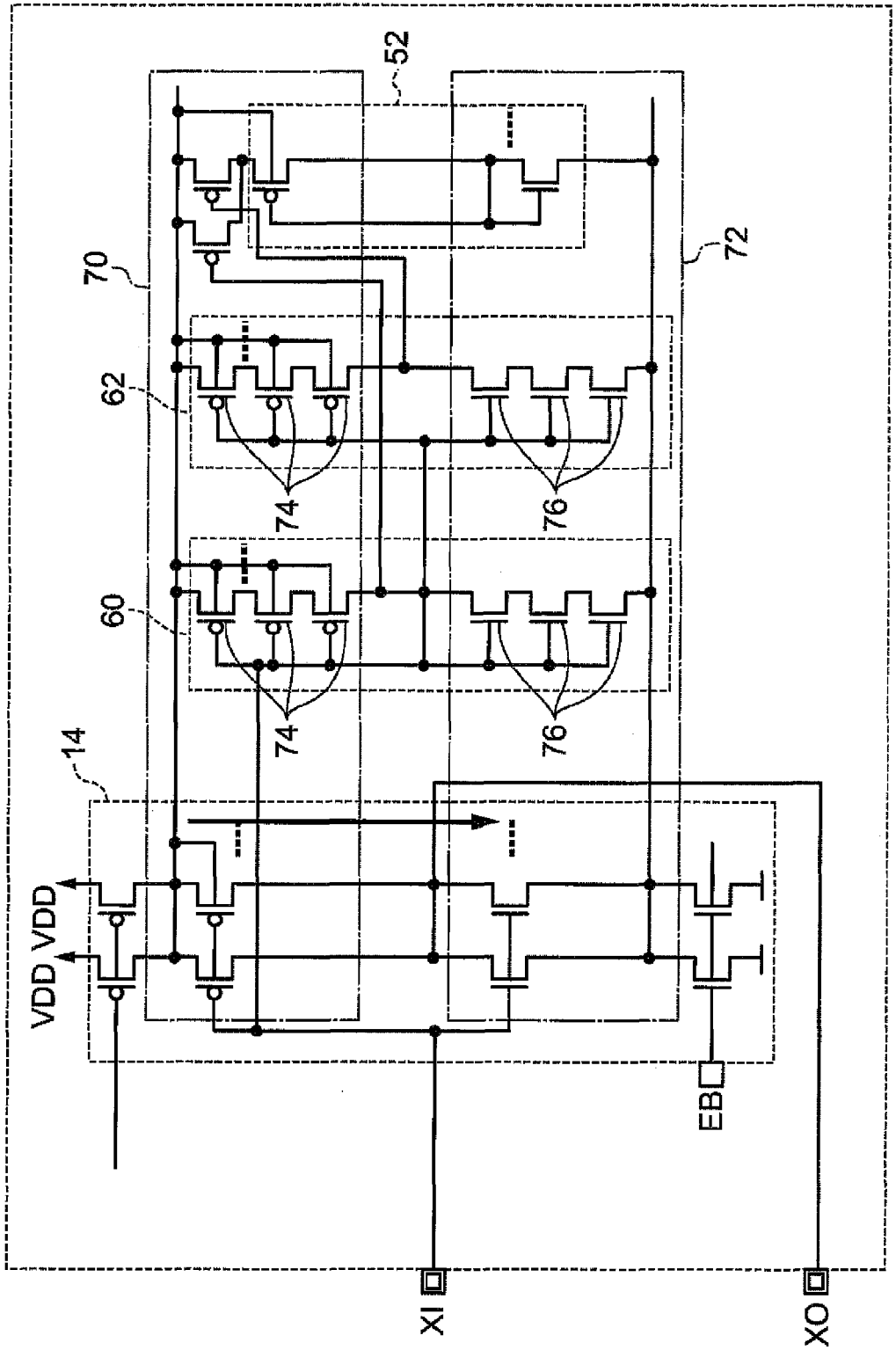
FIG. 12 is a circuit diagram illustrating a detailed example of an oscillator circuit according to a third embodiment.

According to the embodiment, as shown in FIG. 12, plural PMOS transistors 74 serially connected to each other, which have the same gate length and gate width as those of the PMOS transistor 42 of the oscillating buffer 14, and plural NMOS transistors 76 serially connected to each other, which have the same gate length and gate width as those of the NMOS transistor 44 of the oscillating buffer 14, are connected in parallel to each other, so that the first inverter circuit 60 and the second inverter circuit 62 are formed, respectively.

In this way, when the oscillator circuit 10A starts to oscillate, the current from the PTAT current source 12 can be prevented from being shunted to the first inverter circuit 60 and the second inverter circuit 62. Thus, when the oscillator circuit 10A starts to oscillate, a starting current can flow through the oscillating buffer 14 and the oscillation can be rapidly started.

Fourth Embodiment

Next, the fourth embodiment of the invention will be described. The same reference numerals are used to designate the same elements as those of the previous embodiments, and detailed description thereof will be omitted. The following description will be given while focusing on the difference relative to the previous embodiments.

Figure 13:
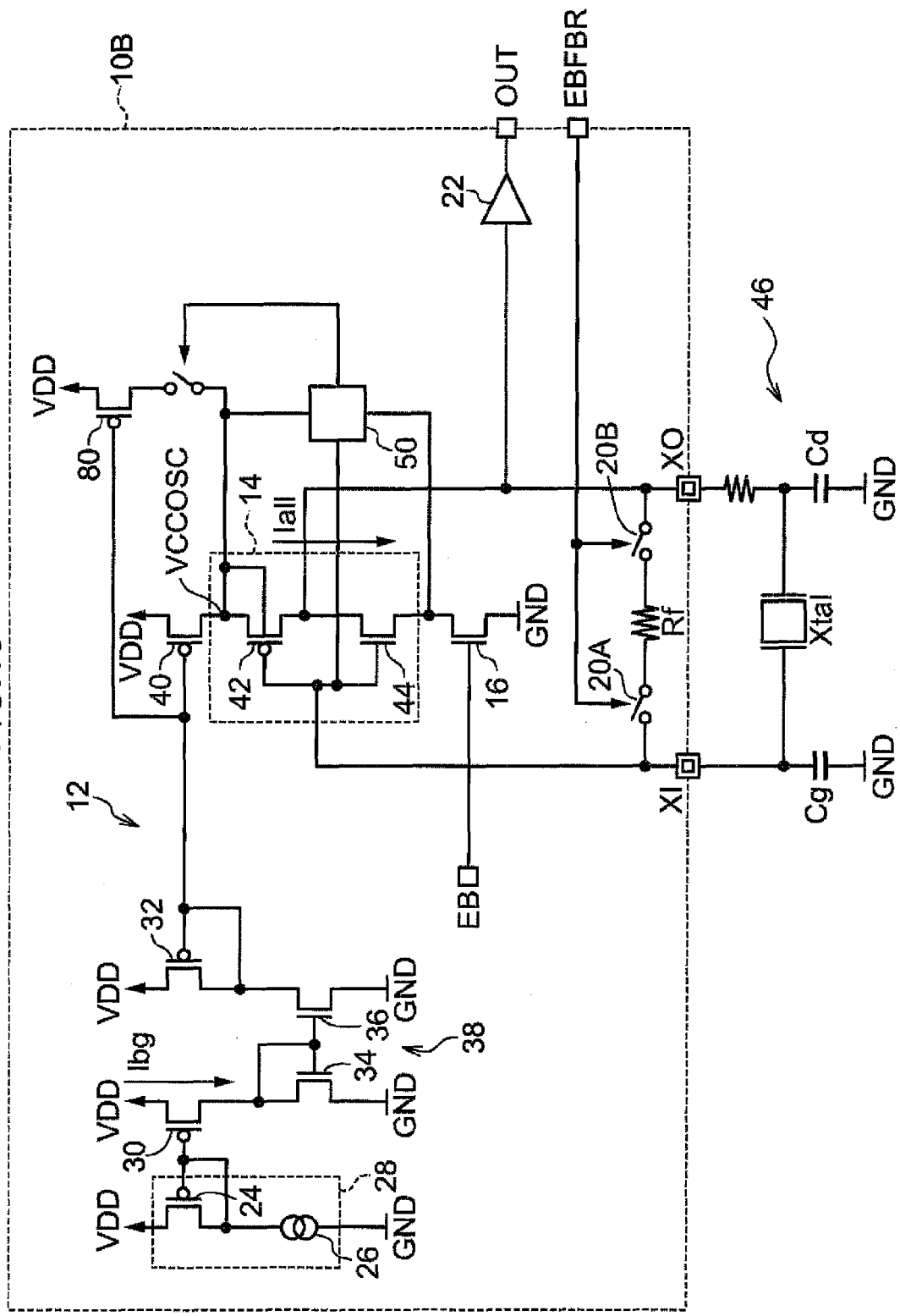
FIG. 13 is a circuit diagram illustrating an oscillator circuit according to a fourth embodiment.

FIG. 13 illustrates an oscillator circuit 10B according to the embodiment. The oscillator circuit 10B is different from the oscillator circuit 10 shown in FIG. 1 as follows. That is, the oscillator circuit 10B includes a PMOS transistor 80 instead of the replica buffer 52. In addition, a gate of the PMOS transistor 80 is connected to a gate of the PMOS transistor 40. Further, a source of the PMOS transistor 80 is connected to the switch device 54. The switch device 54, for example, may be formed with an NMOS transistor.

Figure 14:
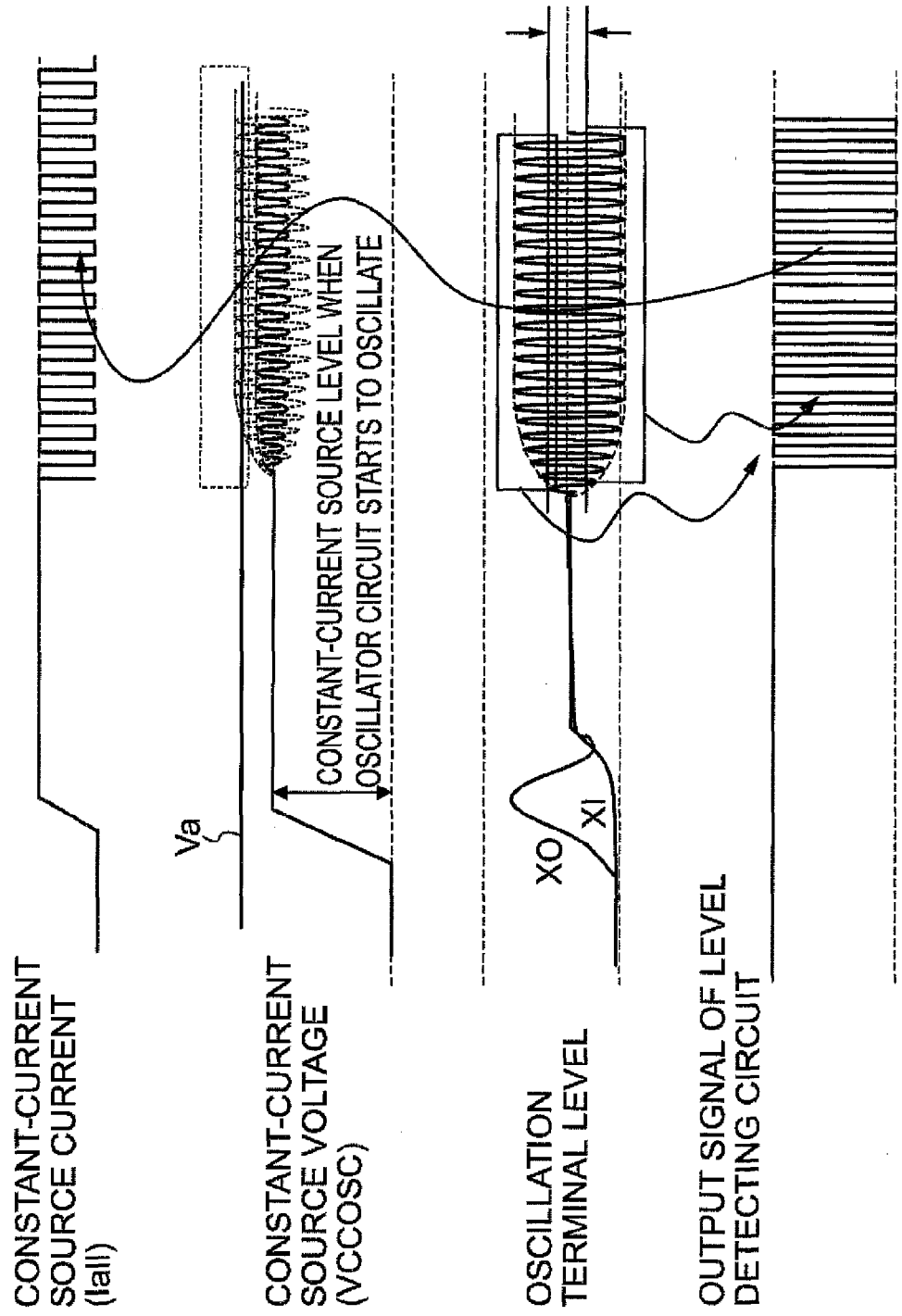
FIG. 14 illustrates voltage levels of each element of an oscillator circuit according to a fourth embodiment.

In the oscillator circuit 10B having the above configuration, when the oscillator circuit 10B starts to oscillate, as shown in the output signal of the level detecting circuit of FIG. 14, the level detecting circuit 50 outputs an H level signal to turn on the switch device 54, and allows the current from the supply voltage VDD to flow through the oscillating buffer 14. Further, when the oscillator circuit 10B starts to oscillate, if the detected amplitude level of the input side of the oscillating buffer 14 is beyond the range of the oscillation bias level Vb±ΔV, the level detecting circuit 50 outputs an L level signal to the switch device 54 to turn off the switch device 54 as shown in the output signal of the level detecting circuit of FIG. 14.

Thus, the switch device 54 is intermittently turned off, and the supply of the current to the oscillating buffer 14 through the PMOS transistor 80 is intermittently controlled. Consequently, as shown in the constant-current source voltage (VCCOSC) of FIG. 14, the voltage level of the node VCCOSC can be prevented from exceeding the breakdown voltage level Va of the PMOS transistor 42 and the NMOS transistor 44 serving as the core transistor. Therefore, the oscillation can be prevented from stopping by the break down of these MOS transistors.

According to the oscillator circuit of an exemplary embodiment, the level detecting unit may be a Schmitt inverter circuit.

According to the oscillator circuit of an exemplary embodiment, the level detecting unit may include a first inverter circuit that outputs the control signal, which is used for allowing the current from the current source to bypass through the replica circuit, to the replica circuit when the detected input voltage is higher than the bias voltage level at the time of the oscillation by an amount equal to or greater than the predetermined amount, and a second inverter circuit that outputs the control signal, which is used for allowing the current from the current source to bypass the replica circuit, to the replica circuit when the detected input voltage is lower than the bias voltage level at the time of the oscillation by an amount equal to or greater than the predetermined amount.

According to the oscillator circuit of an exemplary embodiment, the current source may include an I/O transistor, and the oscillation amplification unit may include a CMOS inverter including an NMOS transistor and a PMOS transistor which are core transistors having a breakdown voltage lower than a breakdown voltage of the I/O transistor.

According to the oscillator circuit of an exemplary embodiment, the current source may include an I/O transistor, the oscillation amplification unit and the replica circuit include a CMOS inverter including an NMOS transistor and a PMOS transistor which are core transistors having a breakdown voltage lower than a breakdown voltage of the I/O transistor, the Schmitt inverter circuit may include a CMOS inverter including an NMOS transistor and a PMOS transistor, which have a gate width and a gate length identical to a gate width and a length of an NMOS transistor and a PMOS transistor of the oscillation amplification unit, and each NMOS transistor and each PMOS transistor are formed at the same well, respectively.

According to the oscillator circuit of an exemplary embodiment, the current source may include an I/O transistor, the oscillation amplification unit and the replica circuit include a CMOS inverter including an NMOS transistor and a PMOS transistor which are core transistors having a breakdown voltage lower than a breakdown voltage of the I/O transistor, each of the first inverter circuit and the second inverter circuit include a CMOS inverter including an NMOS transistor and a PMOS transistor, which have a gate width and a gate length identical to a gate width and a gate length of an NMOS transistor and a PMOS transistor of the oscillation amplification unit, and each NMOS transistor and each PMOS transistor are formed at the same well, respectively.

According to the oscillator circuit of an exemplary embodiment, gates, drains and sources of each NMOS transistor and each PMOS transistor, which constitute the oscillation amplification unit, the replica circuit and the level detecting unit, are arranged such that a current flows through each in the same direction, and each NMOS transistor and each PMOS transistor includes a unit transistor.

According to the oscillator circuit of an exemplary embodiment, the level detecting unit may include plural CMOS inverters connected in parallel to each other, and wherein each CMOS inverter may include plural NMOS transistors respectively coupled to plural PMOS transistors.

According to the oscillator circuit of an exemplary embodiment, each drain of the NMOS transistor and the PMOS transistor, which serve as an output side of the oscillation amplification unit, has a salicide block structure.

According to the oscillator circuit of an exemplary embodiment, the level detecting unit is a Schmitt inverter circuit.

According to the oscillator circuit of an exemplary embodiment, the level detecting unit may include a first inverter circuit that outputs the control signal, which is used for preventing the current from the second MOS transistor from flowing through the oscillation amplification unit, to the switch unit when the detected input voltage is higher than the bias voltage level at the time of the oscillation by an amount equal to or greater than the predetermined amount, and a second inverter circuit that outputs the control signal, which is used for preventing the current from the second MOS transistor from flowing through the oscillation amplification unit, to the switch unit when the detected input voltage is lower than the bias voltage level at the time of the oscillation by an amount equal to or greater than the predetermined amount.

According to the oscillator circuit of an exemplary embodiment, the current source may include an I/O transistor, and the oscillation amplification unit may include a CMOS inverter including an NMOS transistor and a PMOS transistor which are core transistors having a breakdown voltage lower than a breakdown voltage of the I/O transistor.

According to the oscillator circuit of an exemplary embodiment, the current source may include an I/O transistor, the oscillation amplification unit include a CMOS inverter including an NMOS transistor and a PMOS transistor which are core transistors having a breakdown voltage lower than a breakdown voltage of the I/O transistor, the Schmitt inverter circuit may include a CMOS inverter including an NMOS transistor and a PMOS transistor, which have a gate width and a gate length identical to a gate width and a gate length of an NMOS transistor and a PMOS transistor of the oscillation amplification unit, and each NMOS transistor and each PMOS transistor are formed at the same well, respectively.

According to the oscillator circuit of an exemplary embodiment, the current source may include an I/O transistor, the oscillation amplification unit may include a CMOS inverter including an NMOS transistor and a PMOS transistor which are core transistors having a breakdown voltage lower than a breakdown voltage of the I/O transistor, each of the first inverter circuit and the second inverter circuit may include a CMOS inverter including an NMOS transistor and a PMOS transistor, which have a gate width and a gate length identical to a gate width and a gate length of an NMOS transistor and a PMOS transistor of the oscillation amplification unit, and each NMOS transistor and each PMOS transistor may each be formed on the same well, respectively.

According to the oscillator circuit of an exemplary embodiment, gates, drains and sources of each NMOS transistor and each PMOS transistor, which constitute the oscillation amplification unit and the level detecting unit, are arranged such that a current flows through each in the same direction, and each NMOS transistor and each PMOS transistor includes a unit transistor.

According to the oscillator circuit of an exemplary embodiment, the level detecting unit may include plural CMOS inverters connected in parallel to each other, and wherein each CMOS inverter may include plural NMOS transistors respectively coupled to plural PMOS transistors.

According to the oscillator circuit of an exemplary embodiment, each drain of the NMOS transistor and the PMOS transistor, which serve as an output side of the oscillation amplification unit, has a salicide block structure.

According to an aspect of the invention, an overvoltage can be preventing from being applied to an oscillating buffer.

What is claimed is:

1. An oscillator circuit comprising:
    a current source;
    a resonant unit;
    an oscillation amplification unit connected to the current source and connected in parallel to the resonant unit;
    a feedback resistor connected in parallel to the oscillation amplification unit;
    a switch unit having a first end connected to the current source side of the oscillation amplification unit;
    a replica circuit connected between a second end of the switch unit and a ground side of the oscillation amplification unit and having a configuration identical to a configuration of the oscillation amplification unit; and
    a level detecting unit that detects an input voltage of the oscillation amplification unit, and, when the detected input voltage is higher than a bias voltage level at a time of oscillation by an amount equal to or greater than a predetermined amount, or when the detected input voltage is lower than a bias voltage level at the time of the oscillation by an amount equal to or greater than a predetermined amount, outputs to the switch unit a control signal used to allow a current from the current sources to bypass through the replica circuit, to prevent a voltage level of a connection point of the current source and the oscillation amplification unit from exceeding a breakdown voltage of the oscillation amplification unit.

2. The oscillator circuit according to claim 1, wherein the level detecting unit is a Schmitt inverter circuit.

3. The oscillator circuit according to claim 1, wherein the level detecting unit includes:
    a first inverter circuit that outputs the control signal, which is used for allowing the current from the current source to bypass through the replica circuit, to the replica circuit when the detected input voltage is higher than the bias voltage level at the time of the oscillation by an amount equal to or greater than the predetermined amount; and a second inverter circuit that outputs the control signal, which is used for allowing the current from the current source to bypass through the replica circuit, to the replica circuit when the detected input voltage is lower than the bias voltage level at the time of the oscillation by an amount equal to or greater than the predetermined amount.

4. The oscillator circuit according to claim 1, wherein the current source includes an I/O transistor, and the oscillation amplification unit includes a CMOS inverter including an NMOS transistor and a PMOS transistor which are core transistors having a breakdown voltage lower than a breakdown voltage of the I/O transistor.

5. The oscillator circuit according to claim 2, wherein
the current source includes an I/O transistor, the oscillation amplification unit and the replica circuit include a CMOS inverter including an NMOS transistor and a PMOS transistor which are core transistors having a breakdown voltage lower than a breakdown voltage of the I/O transistor,
the Schmitt inverter circuit includes a CMOS inverter including an NMOS transistor and a PMOS transistor, which have a gate width and a gate length identical to a gate width and a gate length of an NMOS transistor and a PMOS transistor of the oscillation amplification unit, and
each NMOS transistor and each PMOS transistor are formed at the same well, respectively.

6. The oscillator circuit according to claim 3, wherein
the current source includes an I/O transistor,
the oscillation amplification unit and the replica circuit include a CMOS inverter including an NMOS transistor and a PMOS transistor which are core transistors having a breakdown voltage lower than a breakdown voltage of the I/O transistor,
each of the first inverter circuit and the second inverter circuit include a CMOS inverter including an NMOS transistor and a PMOS transistor, which have a gate width and a gate length identical to a gate width and a gate length of an NMOS transistor and a PMOS transistor of the oscillation amplification unit, and
each NMOS transistor and each PMOS transistor are formed at the same well, respectively.

7. The oscillator circuit according to claim 5, wherein gates, drains and sources of each NMOS transistor and each PMOS transistor, which constitute the oscillation amplification unit, the replica circuit and the level detecting unit, are arranged such that a current flows through each in the same direction, and each NMOS transistor and each PMOS transistor comprises a unit transistor.

8. The oscillator circuit according to claim 5, wherein the level detecting unit includes a plurality of CMOS inverters connected in parallel to each other, and wherein each CMOS inverter includes a plurality of NMOS transistors respectively coupled to a plurality of PMOS transistors.

9. The oscillator circuit according to claim 4, wherein each drain of the NMOS transistor and the PMOS transistor, which serve as an output side of the oscillation amplification unit, has a salicide block structure.

10. An oscillator circuit comprising:
a current source including a plurality of MOS transistors;
a resonant unit;
an oscillation amplification unit connected to at least one first MOS transistor of the plurality of MOS transistors and connected in parallel to the resonant unit;

a feedback resistor connected in parallel to the oscillation amplification unit;
a switch unit having a first end connected to at least one second MOS transistor different from the first MOS transistor among the plurality of MOS transistors, and a second end connected to a connection point of the first MOS transistor and the oscillation amplification unit; and
a level detecting unit detecting an input voltage of the oscillation amplification unit, and, when the detected input voltage is higher than a bias voltage level at a time of oscillation by an amount equal to or greater than a predetermined amount, or when the detected input voltage is lower than a bias voltage level at the time of the oscillation by an amount equal to or greater than a predetermined amount, outputs to the switch unit a control signal used to prevent a current from the second MOS transistor from flowing through the oscillation amplification unit, thereby preventing a voltage level of a connection point of the current source and the oscillation amplification unit from exceeding a breakdown voltage of the oscillation amplification unit.

11. The oscillator circuit according to claim 10, wherein the level detecting unit is a Schmitt inverter circuit.

12. The oscillator circuit according to claim 10, wherein the level detecting unit includes:
a first inverter circuit that outputs the control signal, which is used for preventing the current from the second MOS transistor from flowing through the oscillation amplification unit, to the switch unit when the detected input voltage is higher than the bias voltage level at the time of the oscillation by an amount equal to or greater than the predetermined amount; and
a second inverter circuit that outputs the control signal, which is used for preventing the current from the second MOS transistor from flowing through the oscillation amplification unit, to the switch unit when the detected input voltage is lower than the bias voltage level at the time of the oscillation by an amount equal to or greater than the predetermined amount.

13. The oscillator circuit according to claim 10, wherein the current source includes an I/O transistor, and the oscillation amplification unit includes a CMOS inverter including an NMOS transistor and a PMOS transistor which are core transistors having a breakdown voltage lower than a breakdown voltage of the I/O transistor.

14. The oscillator circuit according to claim 11, wherein
the current source includes an I/O transistor, the oscillation amplification unit include a CMOS inverter including an NMOS transistor and a PMOS transistor which are core transistors having a breakdown voltage lower than a breakdown voltage of the I/O transistor,
the Schmitt inverter circuit includes a CMOS inverter including an NMOS transistor and a PMOS transistor, which have a gate width and a gate length identical to a gate width and a gate length of an NMOS transistor and a PMOS transistor of the oscillation amplification unit, and each NMOS transistor and
each NMOS transistor and each PMOS transistor are formed at the same well, respectively.

15. The oscillator circuit according to claim 12, wherein the current source includes an I/O transistor, the oscillation amplification unit includes a CMOS inverter including an NMOS transistor and a PMOS transistor which are core transistors having a breakdown voltage lower than a breakdown voltage of the I/O transistor, each of the first inverter circuit and the second inverter circuit includes a CMOS inverter including an NMOS transistor and a PMOS transistor, which have a gate width and a gate length identical to a gate width and a gate length of an NMOS transistor and a PMOS transistor of the oscillation amplification unit, and each NMOS transistor and each PMOS transistor are formed at the same well, respectively.

16. The oscillator circuit according to claim 14, wherein gates, drains and sources of each NMOS transistor and each PMOS transistor, which constitute the oscillation amplification unit and the level detecting unit, are arranged such that a current flows through each in the same direction, and each NMOS transistor and each PMOS transistor comprises a unit transistor.

17. The oscillator circuit according to claim 14, wherein the level detecting unit includes a plurality of CMOS inverters connected in parallel to each other, and wherein each CMOS inverter includes a plurality of NMOS transistors coupled to a plurality of PMOS transistors.

18. The oscillator circuit according to claim 13, wherein each drain of the NMOS transistor and the PMOS transistor, which serve as an output side of the oscillation amplification unit, has a salicide block structure.

* * * * *